(12) United States Patent
Nakane et al.

(10) Patent No.: US 7,692,273 B2
(45) Date of Patent: Apr. 6, 2010

(54) ELECTRONIC COMPONENT COMPRISING ELECTRODES AND RING RESIDUE

(75) Inventors: Naohiro Nakane, Setagaya-Ku (JP); Kimio Takahashi, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/443,192

(22) Filed: May 31, 2006

(65) Prior Publication Data

US 2006/0284202 A1 Dec. 21, 2006

(30) Foreign Application Priority Data

Jun. 21, 2005 (JP) ............................. 2005-180554
May 15, 2006 (JP) ............................. 2006-135071

(51) Int. Cl.
*H01L 23/544* (2006.01)

(52) U.S. Cl. ............... 257/620; 257/797; 257/E33.056; 257/E21.523; 257/E21.524

(58) Field of Classification Search ................ 257/620, 257/797, E33.056, 474, E21.523–E21.524, 257/479, 502, 542
See application file for complete search history.

(56) References Cited

U.S. PATENT DOCUMENTS

| | | | | |
|---|---|---|---|---|
| 5,904,611 A | 5/1999 | Takahashi et al. | ............. | 451/41 |
| 6,149,500 A | 11/2000 | Takahashi et al. | ............. | 451/41 |
| 6,228,684 B1* | 5/2001 | Maruyama | ................... | 438/113 |
| 6,332,835 B1 | 12/2001 | Nishimura et al. | ............ | 451/67 |
| 6,776,691 B2 | 8/2004 | Nishimura et al. | ............ | 451/36 |
| 2002/0149120 A1* | 10/2002 | Sugiyama | ................... | 257/786 |
| 2003/0146694 A1* | 8/2003 | Lee et al. | ..................... | 313/505 |
| 2004/0017162 A1* | 1/2004 | Sato et al. | ................ | 315/169.3 |
| 2005/0093561 A1 | 5/2005 | Watanabe et al. | ........... | 324/763 |
| 2005/0248000 A1* | 11/2005 | Chen et al. | ................... | 257/620 |
| 2006/0284202 A1 | 12/2006 | Nakane et al. | ................ | 257/98 |

FOREIGN PATENT DOCUMENTS

| | | |
|---|---|---|
| JP | 07-181516 | 7/1995 |
| KR | 2003-0067144 | 8/2003 |

OTHER PUBLICATIONS

Korean Official Communication dated Aug. 27, 2007.

* cited by examiner

*Primary Examiner*—Bradley K Smith
*Assistant Examiner*—Mohammad T Karimy
(74) *Attorney, Agent, or Firm*—Fitzpatrick, Cella, Harper & Scinto

(57) ABSTRACT

There are provided an electronic component production method and an electronic component by which the number of scribing processes can be reduced and the productivity can be made higher while surely preventing short circuiting during the production. An electronic component including a short ring residue portion and a method of producing the electronic component are provided.

2 Claims, 8 Drawing Sheets

# ELECTRONIC COMPONENT COMPRISING ELECTRODES AND RING RESIDUE

BACKGROUND OF THE INVENTION

1. Field of the Invention

The present invention relates to an electronic component including an electronic element disposed on a base member (e.g., substrate) and a take-out electrode connected to the electronic element, and a method of producing the same.

2. Related Background Art

An electronic component including an electronic element and a take-out electrode is disclosed in Japanese Patent Application Laid-Open No. H07-181516 (JP 07-181516A).

JP 07-181516A relates to a thin film transistor panel and describes transistors, gate lines connected to the transistors, and terminals thereof. The gate lines are connected to a conductive portion which is provided along side surfaces of a base member and then separated from the conductive portion by scribing. The thin film transistor panel is disposed on a large-size base member and respective liquid crystal display elements are obtained by scribing.

JP 07-181516A describes that the respective liquid crystal display elements are separated from the large-size base member. However, when small-size base members are to be obtained from the large-size base member, it is necessary to perform scribing at least ten times. Here, of the ten-time scribing, eight-time scribing must be accompanied by troublesome handling of the small-size base members. The present inventors have paid attention to such complication.

That is, when four regions "A" are obtained from the large-size base member such as shown in FIG. 2 of JP 07-181516A, firstly two-time scribing is performed for dividing the large-size base member into the respective regions. Because the conductive portion which is provided along the side surfaces of the large-size base member is connected to the gate lines, the conductive portion can be said to be a short ring. Therefore, when the short ring is cut before the first two-time scribing, prevention of a short circuiting cannot be ensured in subsequent steps. In other words, such cutting should not be performed.

Each of four components separated from one another through the first two-time scribing still has a conductive portion.

Because the conductive portion is provided on two sides of each of small-size base members of the four components, it is necessary to perform scribing for removing the conductive portion two times for each component.

The scribing for removing the conductive portion is performed after the large-size base member is divided into small-size base members.

Such scribing is performed for each of the four components, so that the total number of scribing processes is eight (2×4=8).

Therefore, it is necessary to perform scribing ten times in total (2+2×4=10). Further, of the ten-time scribing, eight-time scribing needs to be performed for each base member which has been subjected to the division to become the small piece. However, the handling of the small-size base members is complicated. Thus, the present inventors have considered that there is a room for improving the productivity.

SUMMARY OF THE INVENTION

It is, therefore, an object of the present invention to provide a method of producing an electronic component and an electronic component in which the number of scribing processes is small and the productivity is high while short circuiting during production is surely prevented.

Thus, according to one aspect of the present invention, there is provided an electronic component comprising:

an electronic element disposed on a base member;

a take-out electrode connected to the electronic element; and a short ring residue portion provided on a side of the base member without being connected to the electronic element.

In addition, according to another aspect of the present invention, there is provided a method of producing an electronic component, comprising the cutting step of cutting a large-size base member having at least two electronic components each comprising an electronic element and a take-out electrode connected to the electronic element thereby obtaining at least two of the electronic components, wherein the cutting step of cutting the large-size base member is performed such that a portion of a short ring of an electronic element of one of the electronic components is left in another of the electronic components having another electronic element.

According to the present invention having the above-mentioned constitution, at least one of the following effects can be realized.

1) An isolation region located among a plurality of electronic component portions provided on a large-size base member can be narrowed. As a result, it is possible to provide a plurality of large-size electronic component portions or a large number of electronic component portions on a large-size base member.

2) A step of cutting a large-size base member also serves as a short ring cutting step. As a result, generation of dust can be reduced.

3) The number of scribing processes can be reduced while short circuiting is surely prevented. For example, when four electronic components are to be obtained from a large-size base member, the necessary number of scribing processes is not 10 but at least 3.

DETAILED DESCRIPTION OF THE EXEMPLARY EMBODIMENTS

First Embodiment

An electronic component according to a first embodiment of the present invention is an electronic component comprising:

an electronic element disposed on a base member;

a take-out electrode connected to the electronic element; and a short ring residue portion provided on a side of the base member without being connected to the electronic element.

To be more specific, the electronic component has the short ring residue portion which is not connected to the electronic element and provided on a side of the base member which is other than a side thereof on which the take-out electrode is disposed.

Figure 1:
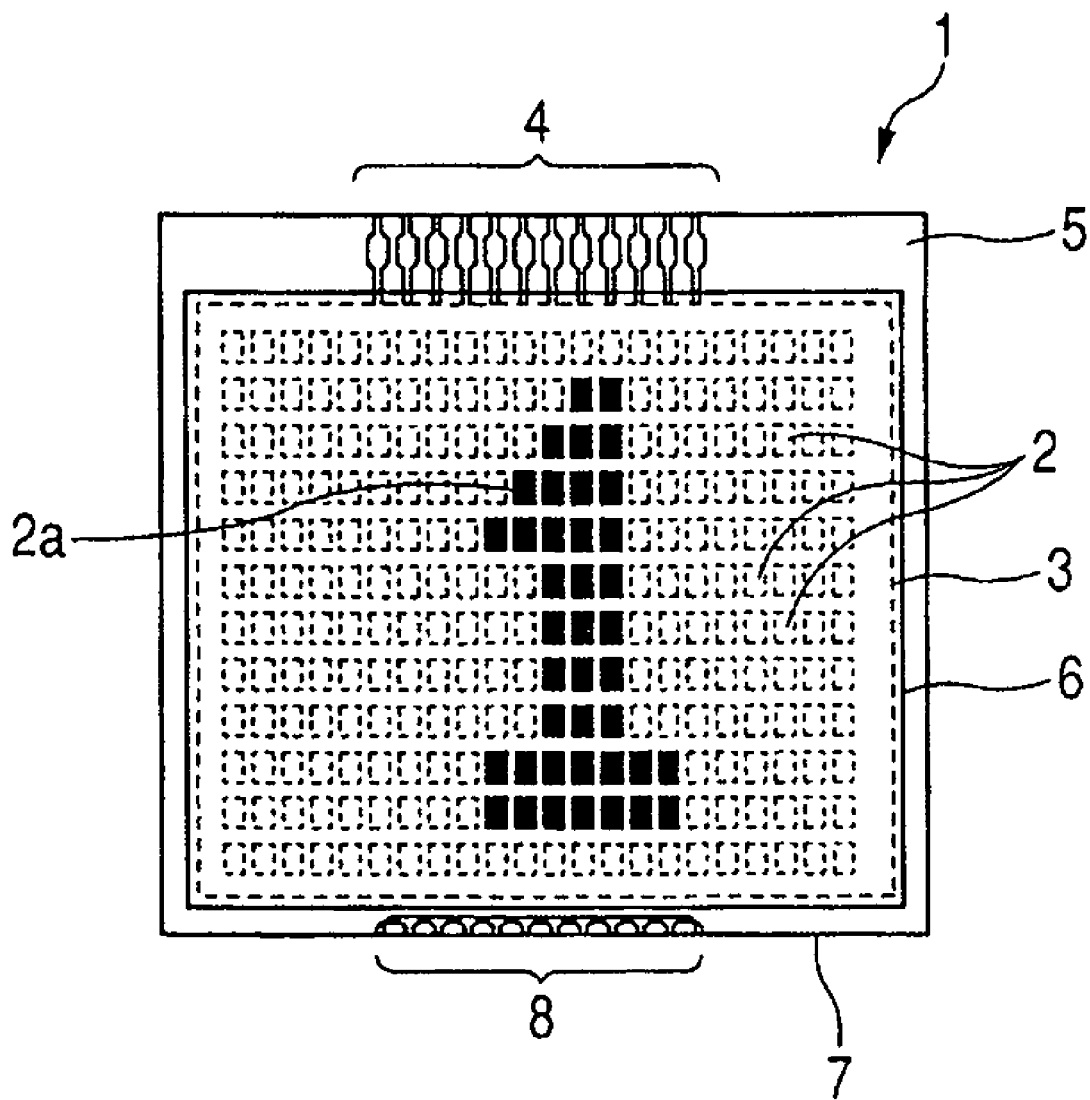
FIG. 1 is a schematic view showing an electronic component according to an embodiment of the present invention.

FIG. 1 is a schematic view showing an electronic component according to this embodiment. Examples of the electronic component include an electronic component having an organic EL element array. Reference numeral 1 denotes an electronic component, 2 denotes pixels, 2a denotes a displayed image, 3 denotes a display region, 4 denotes take-out electrodes, and 5 denotes a base member. Reference numeral 6 denotes a sealing member (or encapsulation member), 7 denotes a side of the base member 5 which is different from the side thereof on which the take-out electrodes are disposed, and 8 denotes a short ring residue portion. A plurality of pixels 2 are disposed in a region of the sealing member 6. The sealing member 6 is provided to prevent the plurality of pixels 2 from being exposed to an external ambience (more specifically, oxygen or moisture) or protect the plurality of pixels 2 from an external shock.

In this embodiment, each of the pixels 2 corresponds to an organic electroluminescent (EL) element including a pair of electrodes and an organic material disposed therebetween. In FIG. 1, as a state in which an image is displayed, a numeral of "1" (reference symbol 2a) is shown. The term "organic EL element array" herein employed refers such a structure that a plurality of organic EL elements are provided on the same base member.

The respective pixels 2 are separately connected to control elements as electronic elements (not shown) and can perform light emission/non-light emission. The electronic elements may be, for example, switching elements such as TFTs. A plurality of the electronic elements are connected to corresponding one of the take-out electrodes 4. As shown in FIG. 1, the plurality of take-out electrodes 4 are on one side of the base member 5.

The short ring residue portion 8 is disposed on a side of the base member 5 which is other than the side thereof having the take-out electrodes 4 disposed thereon. The short ring residue portion 8 is not connected to the electronic elements disposed on the base member 5.

The base member 5 is obtained from a large-size base member by cutting. The short ring residue portion 8 is a residue of a short ring which is separated by the cutting from take-out electrodes disposed on another portion of the large-size base member which is to be cut out from the large-size base member to become another base member 5.

In this embodiment, the short ring residue portion 8 is composed of at least a plurality of branch portions and a common portion (conductive portion located along the another side) connected to the branch portions. Each of the branch portions is a conductive portion disposed in a direction crossing the longitudinal direction of the common portion. However, the short ring residue portion 8 is not limited to such a combination of branch portions and a common portion and may be composed of only a common portion. In this case, during a step of cutting a large-size base member, a short ring may be cut out so as to exclude a plurality of branch portions. Alternately, a further cutting step of cutting at least the branch portions out of the short ring may be expressly added.

This embodiment will be described in more detail.

The term "large-size base member" herein employed refers to a base member on which a plurality of electronic component portions are disposed. The plurality of electronic component portions are disposed in a plane of the large-size base member and separated from one another through an isolation region. Further, when the isolation region is cut, each base member obtained by the cutting will have an electronic component portion thereon. The term "electronic component portion" herein employed refers to an electronic element array constituted by a plurality of electronic elements disposed on the large-size base member which is to be cut.

Before the large-size base member is cut, the electronic elements of each electronic component portion are electrically connected to one another through the short ring, thereby preventing short circuiting. The short ring is disposed in the isolation region.

In other words, the state in which the short ring residue portion 8 is provided on the electronic component obtained by cutting is described in more detail such that when the large-size base member is cut, a short ring connected to an electronic component portion is partly left on a base member on which another electronic component portion is provided.

According to the electronic component according to this embodiment, it is possible to dispose a short ring within a narrow isolation region and on a cutting line.

The thus obtained electronic component will have such a configuration that a short ring residue portion which is not connected to an electronic element is disposed on a side of a base member which is other than a side thereof on which take-out electrodes are disposed.

Of course, an electronic component is simultaneously obtained in which no short ring residue portion is provided on a side of a base member which is other than a side thereof on which take-out electrodes are disposed.

Further, when the electronic component having the above-mentioned structure is obtained, there is at least any one of the following advantages.

1) An isolation region located among a plurality of electronic component portions provided on a large-size base member can be made narrow. As a result, it is possible to provide a plurality of large-size electronic component portions or a large number of electronic component portions on a large-size base member.

2) A step of cutting a large-size base member also serves as a short ring cutting process. As a result, the generation of dust can be reduced.

3) The number of scribing processes can be reduced while short circuiting is surely prevented. For example, when four electronic components are to be obtained from a large-size base member, the necessary number of scribing processes is not 10 but at least 3.

Next, the cutting of a large-size base member will be described with reference to FIG. 2.

Figure 2:
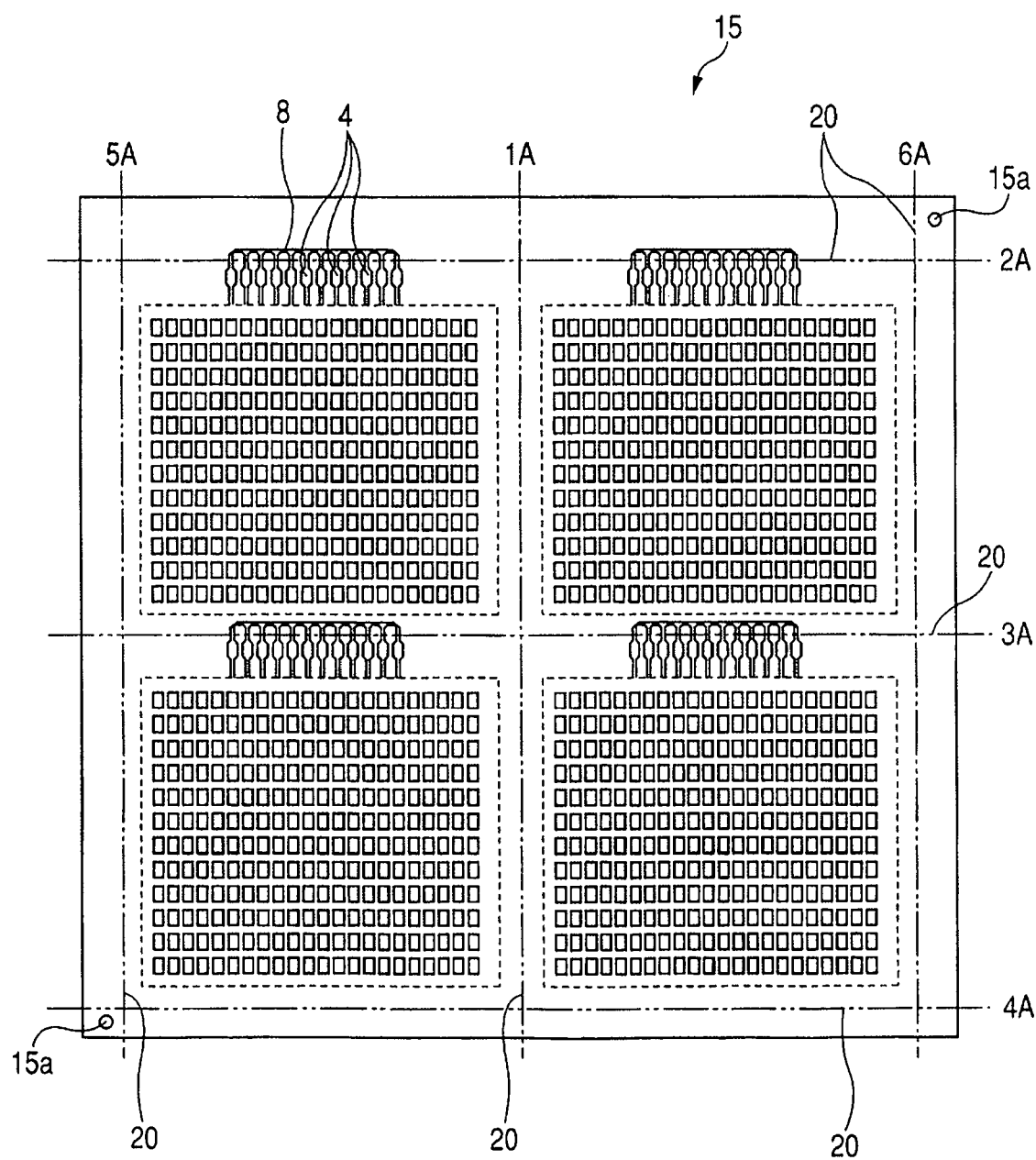
FIG. 2 is a schematic view showing a large-size base member and cutting lines in the case where electronic components according to the embodiment of the present invention are obtained.

FIG. 2 is a schematic view showing a state before electronic components according to this embodiment are obtained from a large-size base member by cutting. Reference numeral 15 denotes a large-size base member and a plurality of (more specifically, four) electronic component portions disposed on the large-size base member. Reference numeral 20 denotes cutting lines. In FIG. 2, reference symbols 1A to 6A denote cutting lines applied based on a cutting order. In FIG. 2, each of white circles indicates an alignment mark.

The electronic component according to this embodiment may be obtained by dividing the large-size base member by cutting along at least three of the cutting lines. To be specific, the three lines include the cutting line 1A for cutting an isolation region on which short rings are not disposed and a plurality of electronic element portions are separated from one another and the cutting lines 2A and 3A for cutting the short rings.

FIG. 2 also shows other cutting lines. In order to make the sizes of the base members obtained by the cutting equal to one another, to reduce the size of each of the base members obtained by the cutting, or to remove an alignment mark or the like from a final product, other cutting lines may be additionally employed. FIG. 2 additionally shows cutting lines 4A to 6A corresponding to the cutting order which are adopted for the purpose of, for example, removing portions which are unnecessary to be left.

In this embodiment, the cutting order for the cutting lines 1A to 6A may suitably be changed as needed. It is more preferable that the cutting of short rings along the cutting line 2A or 3A is performed after the cutting along the cutting line 1A for the isolation region in which no short rings are disposed and through which the plurality of electronic element portions are separated from one another.

Figure 3:
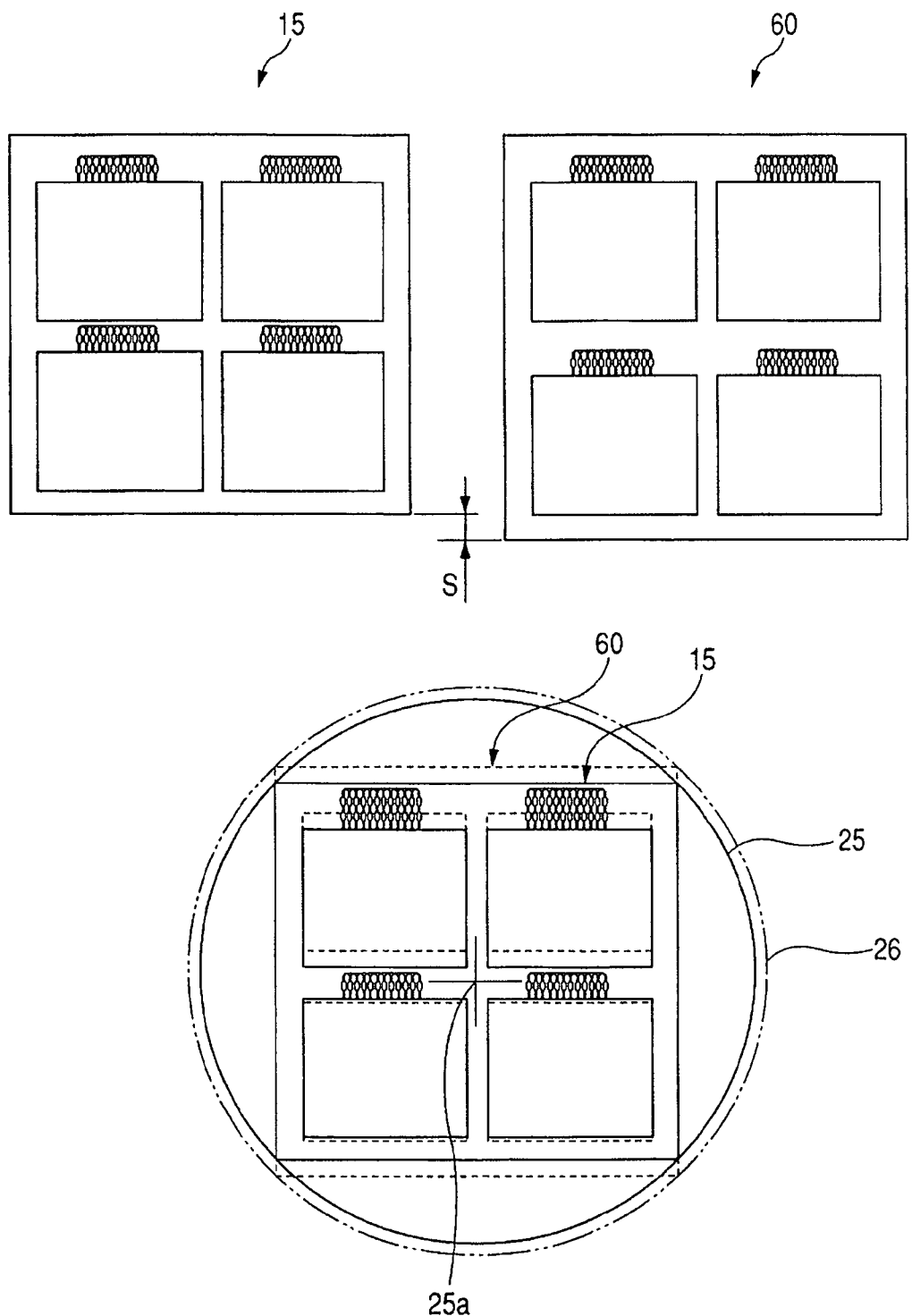
FIG. 3 is a schematic view showing the effect such that the size of a large-size base member is reduced by "S" when a separation distance is reduced.

FIG. 3 is an explanatory view showing a further effect of a method of producing the electronic component according to this embodiment.

Reference numeral 15 denotes a large-size base member in this embodiment, 60 denotes another large-size base member in this embodiment, and 25a denotes a center of the large-size base member. Reference numeral 25 denotes a circular region whose radius is a distance between the center 25a and a farthest point of the large-size base member 15. Reference numeral 26 denotes a circular region whose radius is a distance between the center 25a and a farthest point of the large-size base member 60.

As compared with FIGS. 1 and 2, dots corresponding to a pixel portion are omitted in FIG. 3 for convenience of description, namely in order to make further description with reference to a lower section of FIG. 3 in which the large-size base members 15, 60 are overlapped with each other.

In FIG. 3, both of the base members 15, 60 located in upper right and left sections fall within this embodiment. A difference between both the sections is that the sizes of the large-size base members are different from each other. To be more specific, the size of the large-size base member 15 of the left section in the vertical direction in the drawing is shorter than that of the large-size base member 60 of the right section by a length "S".

This is because the width of the isolation region in which the short rings are disposed is reduced by the length "S".

The result of the size reduction is shown in the lower section of FIG. 3. That is, when the centers of the respective large-size base members 15, 60 are aligned with each other and the circular regions whose diameters are the distances between the center and the farthest points thereof are compared with each other, the circular region based on the large-size base member 15 becomes a smaller circular region whose size is reduced by a amount corresponding to the reduction of the width of the isolation region in which the short rings are disposed.

This is preferable in the following point.

That is, when respective electronic component portions of a large-size base member are to be simultaneously subjected to the same processing, respective electronic component portions of a large-size base member having a narrower circular region can be uniformly processed.

For example, when processing is performed originating from a point on an axis passing through a center point of a base member, respective electronic component portions of a large-size base member having a narrower circular region can be uniformly processed.

To be more specific, in a film formation process such as sputtering, CVD, or vapor deposition, a surface modification process such as UV irradiation or ozone irradiation, or the like, it is preferable to use a large-size base member having a narrower circular region.

Figure 4:
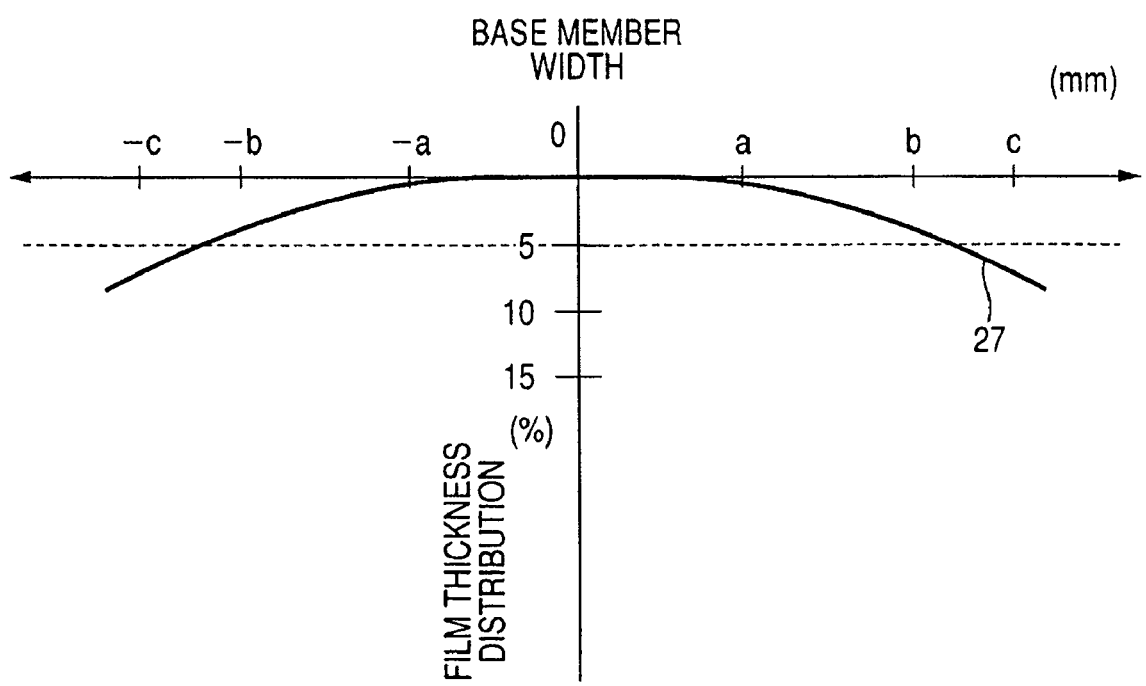
FIG. 4 is a graphical representation showing the relationship between a film thickness distribution and a separation distance from a vapor deposition source as a center during vapor deposition.

FIG. 4 is a graphical representation showing a film thickness distribution and a separation distance from a vapor deposition source located at the center in the case of vapor deposition. In FIG. 4, reference numeral 27 denotes a line indicating the dependence of the film thickness distribution on the distance from the vapor deposition source. As shown in FIG. 4, the film thickness of a film obtained by the vapor deposition significantly changes (reduces) as the distance from the vapor deposition source increases. This phenomenon is substantially common to not only vapor deposition but also other processes utilizing isotropic diffusion from a processing source.

Therefore, of the large-size base members according to this embodiment, the large-size base member in which the isolation region in which the short rings are disposed and through which the plurality of electronic component portions are separated from one another is narrowed is preferable for uniform processing. In other words, in this case, because of the smaller area, processing can be performed with the large-size base member being disposed within a range ±b within which the film thickness distribution in FIG. 4 does not significantly change, more preferably, within a range ±b, which is preferable for uniform processing.

Thus, it is preferable to vapor-deposit an organic material for constituting organic EL elements on such a large-size base member or to form a protective layer for protecting organic EL elements.

The electronic component according to this embodiment is described by taking an electronic component having an organic EL element array as an example. The organic EL element array according to this embodiment can be preferably used as a display for displaying an image.

As described above, the electronic component according to this embodiment has a switching element for light emission or drive of an organic EL element as an electronic element.

In this case, a step of providing the organic EL element in the electronic component is further added. In such a case, a step of forming the organic EL elements in the electronic component portions may be performed before the large-size base member is cut. Alternatively, a step of forming the organic EL elements in the electronic component may be performed after forming the electronic component portions on the large-size base member and then cutting it.

It is more preferable to perform the step of forming the organic EL elements in the electronic component portion before the step of cutting the large-size base member. Therefore, the deterioration of the elements resulting from dust caused during cutting can be prevented.

It is preferable that the step of forming a sealing member on the organic EL elements is performed before the step of cutting the large-size base member and after the step of forming the organic EL elements. The step of forming the sealing member may be performed after the step of forming the organic EL elements and the step of cutting the large-size base member.

The sealing member may have the structure such as shown in FIG. 1. That is, the sealing member may be a member having an area smaller than that of a base member obtained by cutting the large-size base member or a member provided extending over the isolation region located among the electronic component portions on the large-size base member.

The sealing member may be a transparent base member such as a glass sheet or silicon nitride (which may contain at least one of oxygen and hydrogen) film. The sealing member shown as an example in FIG. 1 is a cover glass sheet disposed on a silicon nitride film as a passivation film, which is disposed on the organic EL elements. When the electronic component shown in FIG. 1 is to be obtained, a step of disposing the organic EL element array on the large-size base member is necessary. In addition, it is necessary to sequentially perform a step of forming the passivation film on the organic EL element array and a step of disposing the cover glass sheet for each of the electronic component portions and then to perform the step of cutting the large-size base member.

Incidentally, the electronic component according to this embodiment can be applied to uses other than the electronic component having the organic EL element array. For example, the electronic component according to this embodiment can be used for an electronic device such as a display or memory having organic FETs. Alternatively, the electronic component according to this embodiment can be used for various electronic devices including a switching element, a memory element, or a capacitor element, irrespective of whether the material of a semiconductor portion of the electronic component is an inorganic material or an organic material. Examples of the various electronic devices include a liquid crystal display, a plasma display, and an area sensor.

Further, the sealing member may be disposed in such electronic components other than the electronic component having the organic EL element array.

Incidentally, the electronic component according to the first embodiment of the present invention has been described by taking as an example the electronic component including the short ring residue portion which is not connected to the electronic element and provided on the side of the base member which is other than the side thereof on which the take-out electrodes are disposed.

Figure 8:
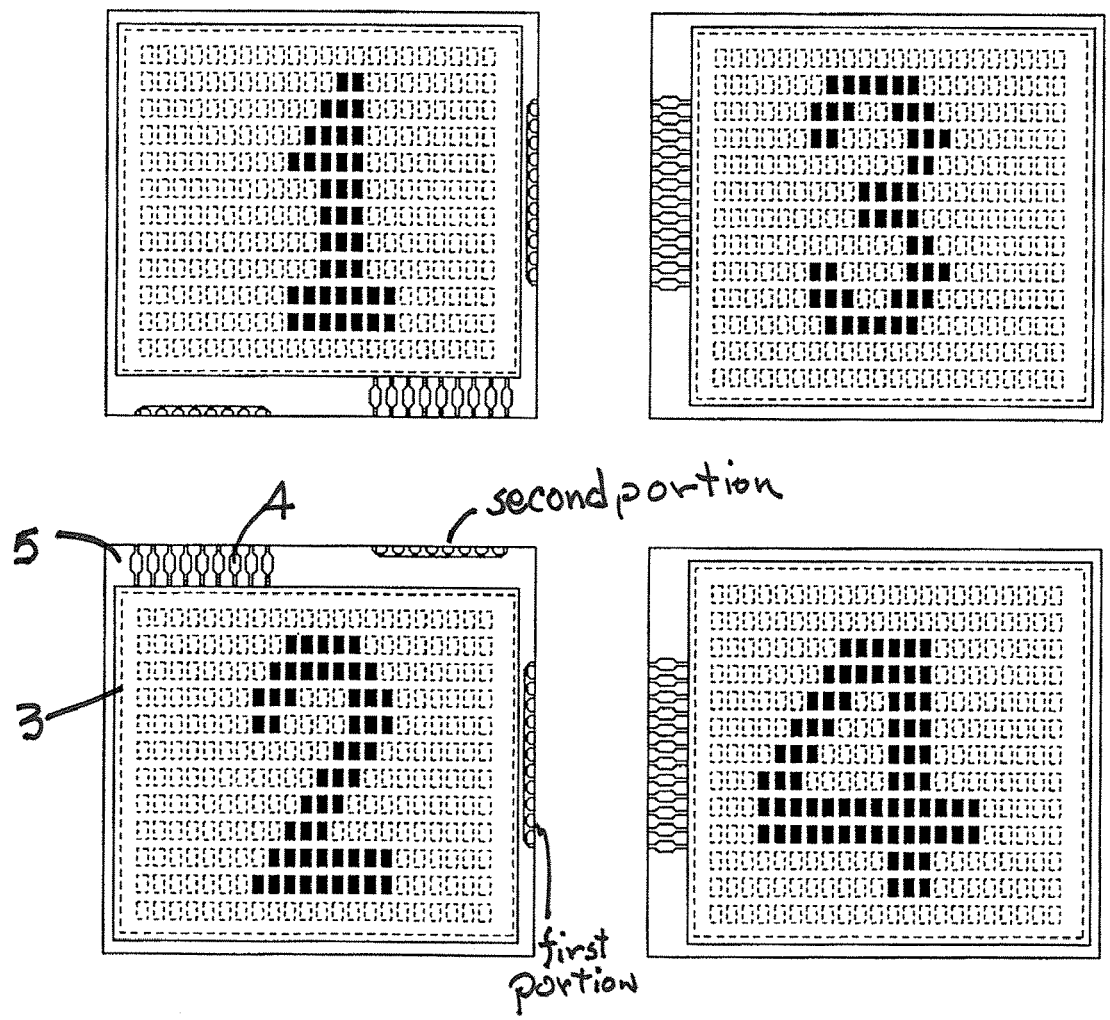
FIG. 8 is a schematic view showing electronic components according to yet still another embodiment of the present invention.

However, the structure of the electronic component according to the present invention may be such that a short ring residue portion is provided on the same side of the base member on which the take-out electrodes are disposed. FIG. 8 shows another structure using the electronic component according to this embodiment.

FIG. 8 shows four electronic components.

In FIG. 8, the four respective electronic components display images of "2", "3", and "4" for convenience of presentation.

Of the four electronic components, each of the electronic components on which the images "1" and "2" are displayed has the short ring residue portion provided on the same side of the base member on which the take-out electrodes are disposed.

Such a structure is particularly preferable in the case where the display screen has a size of, for example, 5 inches or more, further, 15 inches or more.

When the display region is not square but rectangular and when the take-out electrodes are provided in a longer side portion of the rectangular region, the short ring residue portion can be disposed in a part of the long side portion in which the take-out electrodes are not provided.

As a result, the part of the long side portion in which the take-out electrodes are not provided can be effectively used.

Moreover, because the sides of the base member other than the side thereof on which the take-out electrodes and the short ring residue portion are provided can be located close to the display region, the contour of the base member can be located close to that of the display region, whereby the size of the electronic component can be reduced.

Incidentally, FIG. 8 also shows a structure in which the short ring residue portion is disposed on a side intersecting with the side on which the take-out electrodes are disposed as described below in a second embodiment. Therefore, the short ring residue portion may be disposed also on the side intersecting with the side on which the take-out electrodes are disposed.

Second Embodiment

An electronic component according to this embodiment is an electronic component in which a short ring residue portion is disposed on a side intersecting with a side on which take-out electrodes are disposed. Other structures are identical to those of the electronic component according to the first embodiment.

Figure 5:
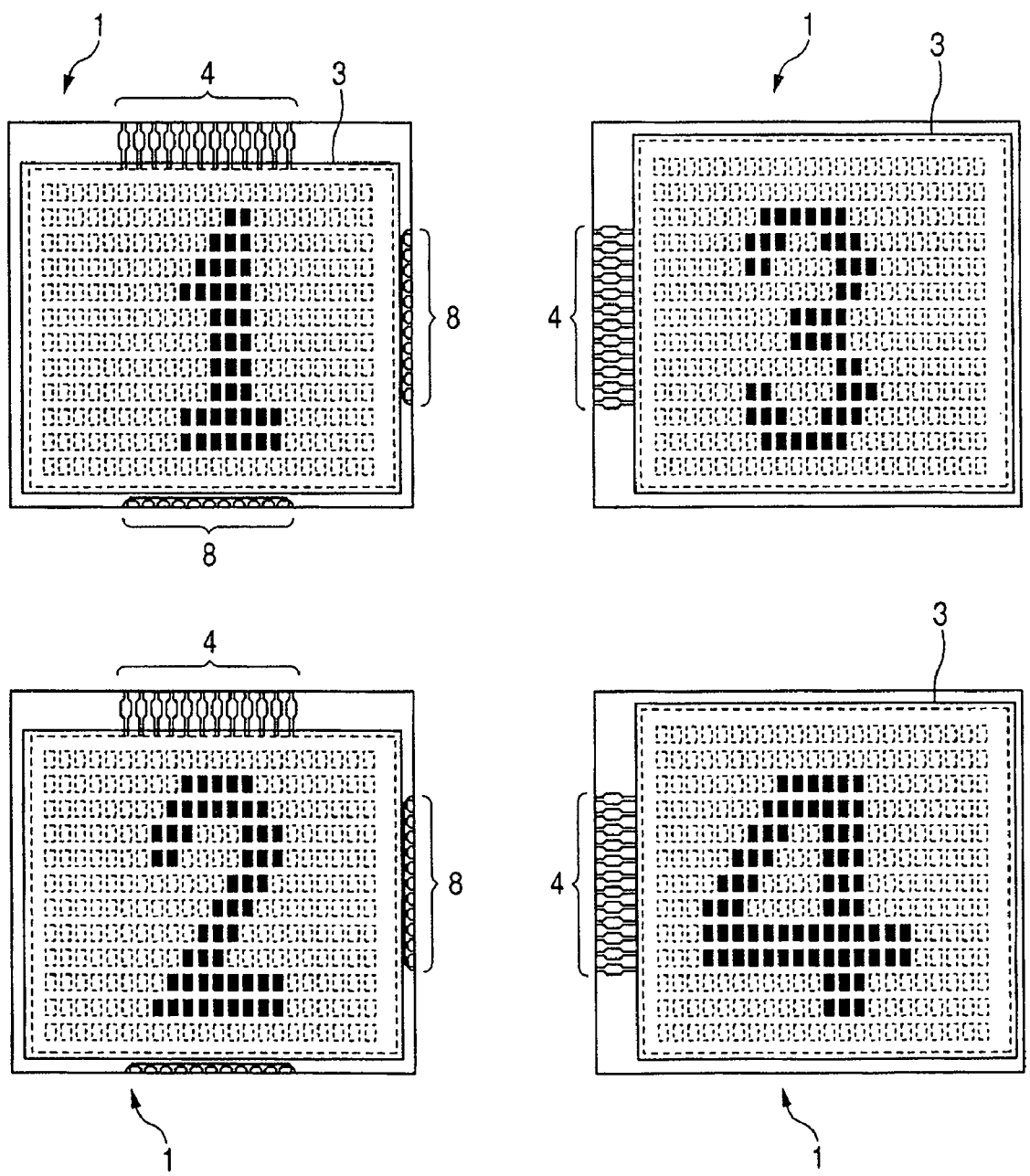
FIG. 5 is a schematic view showing electronic components according to another embodiment of the present invention.

FIG. 5 is a schematic view showing the electronic component according to this embodiment. FIG. 5 shows four electronic components, each of which has the organic EL element array. Images of "1", "2", "3", and "4" are displayed on display screens of the respective electronic components. Each of the electronic components on which the images "1" and "2" are displayed includes a short ring residue portion 8 disposed on a side of a base member which is other than a side thereof on which take-out electrodes 4 are disposed, of respective sides of the base member. To be more specific, the short ring residue portion 8 is disposed on a side located in a direction intersecting with the side on which the take-out electrodes 4 are disposed.

Each of the electronic components on which the images "3" and "4" are displayed does not have a short ring residue portion 8. The electronic component on which the image "1" is displayed further has another short ring residue portion 8, unlike the electronic component on which the image "2" is displayed. To be more specific, the other short ring residue portion 8 is disposed on a side which is in opposition to and in the same direction as the side on which the take-out electrodes 4 are disposed, of the sides of the base member.

Figure 6:
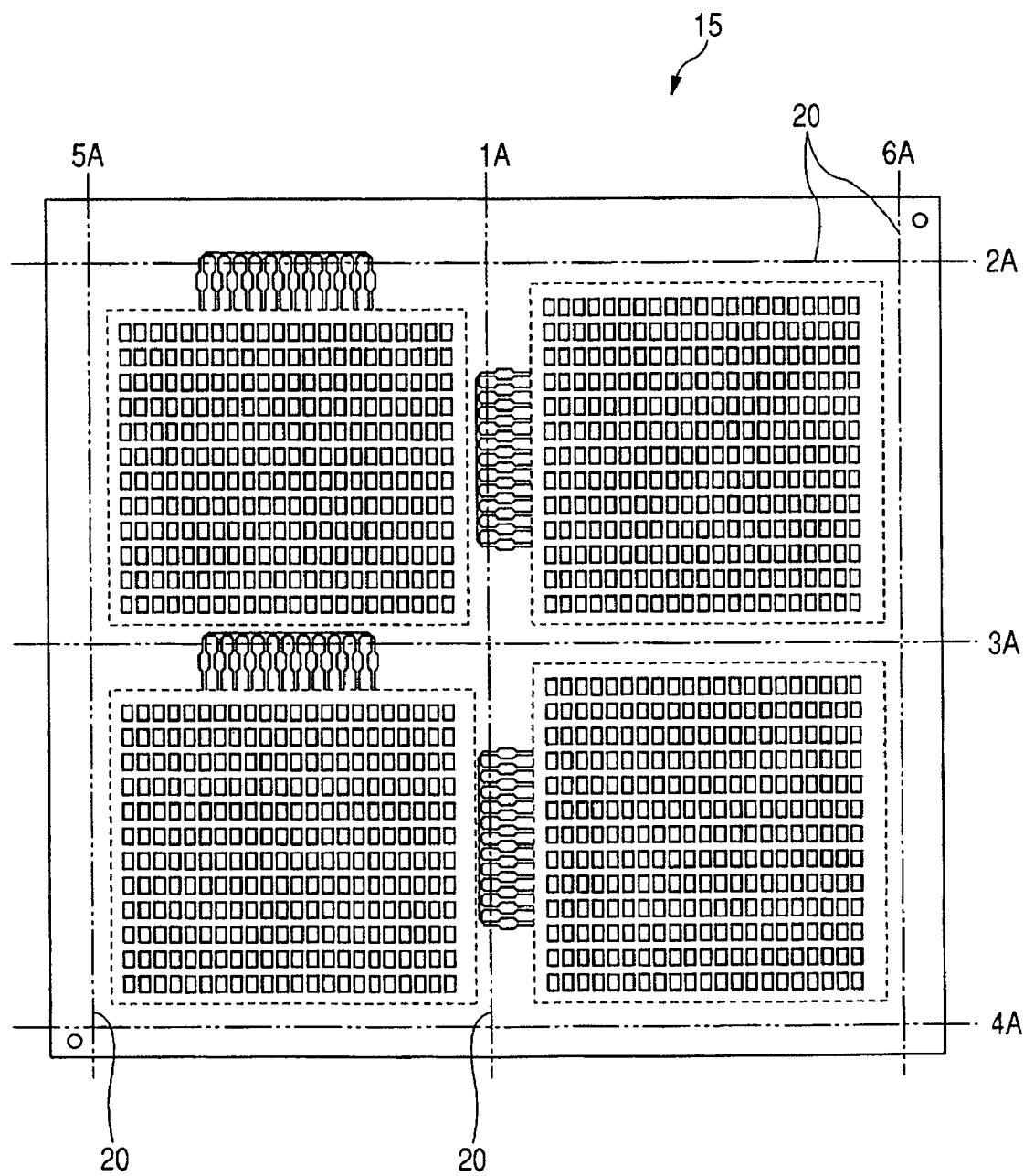
FIG. 6 is a schematic view showing a large-size base member and cutting lines in the case where electronic components according to the another embodiment of the present invention are to be obtained.

The respective electronic components are obtained by dividing a large-size base member such as shown in FIG. 6. In this embodiment, the four electronic components can be obtained by performing the step of cutting the large-size base member at least three times. As shown in FIG. 6, when the short rings are disposed on the cutting lines of the isolation region among the respective electronic component portions, all the short rings of the respective electronic component portions can be cut by performing the step of cutting the large-size base member three times, along the cutting lines 1A, 2A and 3A.

Third Embodiment

An electronic component according to this embodiment is one of more than four electronic components obtained by cutting a large-size base member. Other structures are identical to those of the electronic component according to at least one of the first embodiment and the second embodiment.

Figure 7:
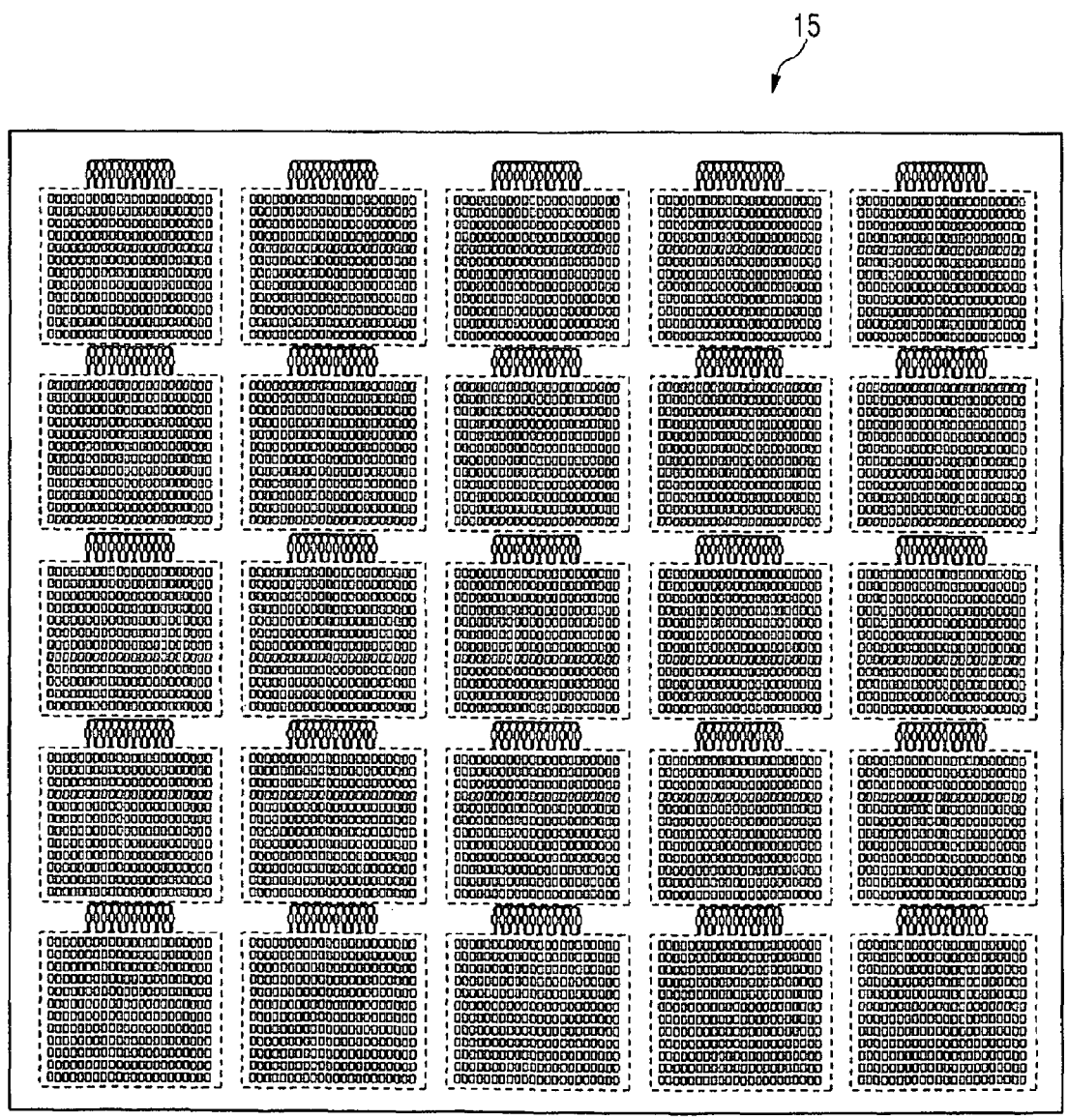
FIG. 7 is a schematic view showing a state in which a large-size base member and 25 electronic component portions are disposed in the case where electronic components according to still another embodiment of the present invention are to be obtained.

FIG. 7 is a schematic view showing more than four electronic component portions disposed on a large-size base member before the electronic component according to this embodiment is obtained by cutting. FIG. 7 shows 25 electronic component portions.

As described above, the electronic component according to this embodiment is one of more than four electronic components obtained by cutting the large-size base member.

According to this embodiment, a large number of electronic components each having a small area can be disposed on a large-size base member having predetermined longitudinal and lateral dimensions.

Description is made by taking as an example a large-size base member having longitudinal and lateral dimensions of 370 mm×470 mm. Further, when the area of each of the electronic components is 2.4 inches square and the short-side length of each of the short rings is 3 mm, it is assumed that the separation distance between the respective electronic component portions (width of the region on which the short ring is disposed) is 6 mm.

When there is a configurational relationship as shown in FIG. 7, that is, when the short rings connected to the respective electronic components are disposed on the large-size base member in the same direction, six electronic components can be disposed in the vertical direction in the plane of FIG. 7.

Even when the separation distance between the respective electronic component portions is larger than 6 mm, it is possible to obtain an electronic component according to this embodiment, that is, an electronic component in which a short ring residue portion is provided on a side of a base member which is other than a side thereof on which take-out electrodes are disposed.

It is more preferable that the separation distance between the respective electronic component portions is made substantially equal to the short-side length of each of the short rings to locate the cutting line on each of the short rings, so that a large number of electronic components can be obtained from a single large-size base member.

For reference, when a base member is cut using a conventional base member cutting technique and then short rings are cut, there is needed a minimum distance of at least 3 mm between a cutting line for cutting the base member and a cutting line for further cutting the short ring. Further, when the area of each electronic component and the short-side length of each short ring are equal to the above-mentioned numeral values, it is necessary to further increase the distance between electronic component portions by 3 mm. As a result, only five electronic components instead of six ones can be obtained from the large-size base member having the same area in the vertical direction in the plane of FIG. 7, depending on the size of the frame portion of the base member.

EXAMPLES

Hereinafter, examples of the present invention will be described. However, the present invention is not limited to the examples.

Example 1

FIG. 1 shows an organic EL panel 1 according to the present invention.

The panel shown in FIG. 1 is obtained from the base member 15 shown in FIG. 2. Specifically, the panel is obtained by performing vapor deposition of an organic light emitting layer through mask vapor deposition using a vacuum vapor deposition apparatus, then forming a transparent electrode (not shown) thereon, thereafter performing a sealing step to prepare the base member 15, and cutting the base member 15 into respective panels.

Further, as an example of the state in which an image is displayed, a numeral of "1" is indicated.

FIG. 2 shows the base member 15 before the panel 1 is obtained by cutting.

In FIG. 2, the base member 15 which is a glass substrate has four organic EL panels formed thereon. The base member has TFTs and circuits formed thereon. Respective take-out electrodes for the circuits are disposed on the base member. A short ring 8 is provided in each of the take-out electrodes 4 to protect the TFTs.

The alignment marks 15a for masking and alignment in the vapor deposition apparatus are diagonally disposed.

As is seen from FIG. 2, each of the alignment masks has a circular shape, which is the same shape as that of each of alignment masks provided in a vapor deposition mask (not shown).

FIG. 1 shows the panel 1 obtained from the glass base member 15 shown in FIG. 2 by the cutting after the sealing step.

In the panel 1, on each of the TFTs on the glass base member 5, there is formed a thin film for organic light emission including organic layers and electrode layers for each of the pixels 2. Further, as shown by the display example 2a, an image can be displayed using the respective pixels.

The glass sealing member 6 is bonded to the glass base member 5 using a UV curable resin through the sealing step.

The sealing glass has an inner surface formed in a recess shape by etching, and a film of a moisture absorbent material (not shown) is provided in the recess portion of the inner surface, thereby preventing the deterioration of the organic material due to moisture absorption.

As can be seen from FIG. 1, in the panel 1, the take-out electrodes 4 are disposed in such a positional relationship that the tips thereof are cut simultaneously with the contour cutting of the glass base member 5. Therefore, the short ring is cut away, so that the panel becomes useable.

Further, as shown in FIG. 1, a short ring 8 which has been provided in take-out electrodes 4 of another panel remains on a side 7 opposed to the take-out electrodes 4 of the panel 1.

This means that the remaining short ring 8 has been once disposed in such a positional relationship that the short ring 8 can be cut away simultaneously with the contour cutting of the side 7 of the panel 1.

Next, a method of cutting the substrate 15 will be described with reference to FIG. 2.

In FIG. 2, the alternate long and two short dashed lines 20 represent cutting lines for obtaining the respective organic EL panels by cutting. Reference symbols 1A, 2A, 3A, 4A, 5A, and 6A which are provided to the cutting lines indicate the number of cutting lines.

Therefore, it can be seen from FIG. 2 that by performing cutting three times along the cutting lines 1A, 2A, and 3A, four organic EL panels can be obtained. Further, the frame portion of the base members can be cut away along the other cutting lines 4A, 5A, and 6A, so that the cutout can be completed by six-time cutting.

The number of cuttings of 6 means that the cutout of the panels can be completed with a number of cuttings which is less by one (1) than that in the case of a structure in which a part of a short ring does not remain in another panel.

As is seen from FIG. 2, during the above-mentioned cutting, the cutting of short rings and the contour cutting are simultaneously done by the cutting along the second cutting line 3A for cutting the center portion of the base member. As a result, it can be understood that the short ring is left on a base member adjacent to another base member to which take-out electrodes are connected.

Thereby, the base member can easily be divided. That is, when a crack or a marking-off line is formed using a laser or a scriber and then hand scribing is performed for cutting, a base member can be easily divided. For more details, by only holding panels which are adjacent through a cutting line and bending them about the cutting line in opposite directions, the base member can be easily divided.

Thus, it is unnecessary to particularly provide a holding margin for breaking (or division), so that the size of the base member 15 can be reduced by an amount corresponding to the margin.

In general, the margin needs to be at least 3 mm, and is preferably about 10 mm when considering the actual workability. In this embodiment, it is unnecessary to provide such a margin, with the result that the size of the entire base member can be reduced.

Next, FIG. 3 shows that the size of a base member 15 according to this example is different from the size of another base member 60 also according to this example.

When comparing the sizes of the base members 15, 60 according to this example with each other, it can be seen that the widths of the both base members are equal to each other but the length of the base member 15 is smaller than the length of the base member 60 by the length "S".

It has been widely known that in a vapor deposition apparatus using a single vapor deposition source, there is a limitation on a size of a base member in which the film thickness distribution of a film vapor-deposited thereon can be made uniform.

When a single vapor deposition source of a vapor deposition apparatus is located in the position of the base member center 25a of the base members 15, 60, vapor deposition is performed by concentrically emitting a vapor for deposition from the vapor deposition source.

In FIG. 3, because of the length "S" as the size difference, in the case of the base member 15, a required minimum area in which uniform vapor deposition can be performed (hereinafter, referred to as "minimum vapor-depositable area") corresponds to the circular region 25, while in the case of the base member 60, the required minimum area corresponds to the circular region 26, so that the circular region 25 is a smaller circle.

Next, description will be made with reference to FIG. 4. FIG. 4 is a conceptual diagram illustrating the relationship between the film thickness distribution of vapor deposit and the base member width in the case where such a single vapor deposition source is used.

In the graph of FIG. 4, the abscissa indicates the base member width in which the center position corresponds to 0 and the ordinate indicates the film thickness distribution (i.e., film thickness deviation). As can be seen from FIG. 4, the deviation of the film thickness at the central portion of the base member in the width direction is substantially 0, so that there is no problem. However, the uniformity of the film thickness deteriorates with the increase of the base member width (i.e., distance from the center position). That is, when the base member width is within a range of −a to +a, the deviation of the film thickness is substantially 0. On the other hand, when the base member width is within a range of −b to +b, the deviation is approximately 4%. Further, when the base member width is within a range of −c to +c, the deviation is approximately 9%.

In the case of the panel used in the present example, the film thickness deviation needs to be 5% or less. Therefore, in terms of the conceptual diagram of FIG. 4, the allowable range is a range having a base member width which is slightly wider than the range of from −b to +b, as indicated by the intersection points between the solid curved line 27 and the dashed straight line which crosses the ordinate at 5%.

As described above, because an area necessary for vapor deposition becomes a larger circle with an increase in size of a base member, there is a fear that a desired film thickness distribution may not be achieved in some cases.

In this example, the constitution is adopted in which at the time of contour cutting of panels, a short ring is cut away and the cut away short ring is left in an adjacent panel. Thereby, a base member with a minimum contour size can be realized. Thus, vapor deposition can be performed within a minimum vapor-depositable area, with the result that it is possible to use a region in which the deviation of the film thickness at the time of vapor deposition is small.

Further, the base member contour size can be reduced. Thereby, the distance between the base member and the vapor deposition source can be set to a shorter distance, so that there can be obtained the effect that it is possible to improve the use efficiency of materials, save materials, and reduce the panel production cost.

Example 2

FIG. 5 is a view illustrating Example 2 of the present invention in which the shapes of panels obtained by cutting are shown.

As can be seen from the figure, there is shown a state in which a base member is cut to be separated into panels 1. The respective panels display the images of "1", "2", "3", and "4" as image display examples. Each of the panels 1 on which the images "1" and "2" are displayed has the short ring residue portion 8 located as shown in the figure. The short ring residue portion 8 is disposed on one of two sides intersecting with the side on which the take-out electrodes 4 are disposed.

Further, as is seen from the figure, each of the panels 1 on which the images "3" and "4" are displayed has no short ring residue portion 8. Moreover, the panel 1 on which the image "1" is displayed further has another short ring residue portion 8, unlike the panel 1 on which the image "2" is displayed. That is, the other short ring residue portion 8 is disposed on a side which is located in opposition to and in the same direction as the side on which the take-out electrodes 4 are disposed, of the sides of the base member. It can be seen from the figure that the orientation of each of the panels on which the images "1" and "2" are displayed is different from the orientation of each of the panels on which the images "3" and "4" are displayed and the sizes of corresponding pixel portions are different from each other.

The respective panels 1 are obtained by cutting and dividing the base member shown in FIG. 6. In this example, by performing cutting steps at least three times, that is, by performing cuttings along the cutting lines 1A, 2A, and 3A, the four panels 1 can be obtained. The cutout of the panels having suitable sizes is performed by cuttings along the cutting lines 4A, 5A, and 6A.

According to the above-mentioned constitution, even when panels which have different sizes and in which the directions of take-out electrodes are different from one another are disposed on a single base member, division can be achieved by three-time cutting while adjusting the balance between the contour cutting position and the panel sizes.

Further, even when two or more short rings were left in a panel obtained by cutting, there was found no particular problem to the display characteristics of the panel.

As described above, because various types of panels having different sizes are disposed on a single base member and a short ring is left in an adjacent panel is used, it is possible to produce a plurality of panels from a base member having a minimum size.

Example 3

FIG. 7 is a schematic view illustrating Example 3 of the present invention in which a base member 15 relatively larger than the base member used in each of Examples 1 and 2 is used.

In the figure, a structure is shown in which 25 panels in total are mounted.

Even when the large number of panels are arranged, cutting is performed similarly as Example 1. In this case, short rings are disposed in a positional relationship such that lines for cutting the short rings also serve as contour cutting lines and the short rings are left in panels located on upper sides.

Thus, even when a large number of panels are arranged on a surface as in this example, it is possible to provide a base member having a minimum size which corresponds to the number of panels.

This application claims priorities from Japanese Patent Application Nos. 2005-180554 filed on Jun. 21, 2005, and 2006-135071 filed on May 15, 2006, which are hereby incorporated by reference herein.

What is claimed is:

1. An organic EL panel comprising:
   an organic EL element disposed on a base member;
   a take-out electrode locally formed on the base member at a portion closer to one end of one side of the base member as compared to an opposing end thereof, the take-out electrode being connected to the organic EL element; and
   a short ring residue portion locally formed on the base member at a portion closer to the opposing end of the one side of the base member without being connected to the organic EL element, wherein the short ring residue portion and the take-out electrode are located on a same side of the base member.

2. A set of organic EL panels comprising:
   a base member;
   a first organic EL panel provided on the base member and including a first organic EL element and a first take-out terminal connected to the first organic EL element;
   a second organic EL panel provided adjacent to the first organic EL panel on the base member, the second organic EL panel including a second organic EL element and a second take-out terminal connected to the second organic EL element;
   a first short ring connected to the first take-out terminal, the first short ring being connected to the first organic EL element of the first organic EL panel; and
   a second short ring connected to the second take-out terminal, the second short ring being connected to the second organic EL element of the second organic EL panel,
   wherein the first organic EL panel and the second organic EL panel are disposed so as to be point-symmetrical to each other, such that take-out directions of the first take-out terminal and the second take-out terminal of the first organic EL panel and the second organic EL panel are opposite to each other,
   wherein a residue portion of the first short ring, which is to be separated from the first short ring, is located closer to the second organic EL element of the second organic EL panel than to the first organic EL element of the first organic EL panel, and
   wherein a residue portion of the second short ring, which is to be separated from the second short ring, is located closer to the first organic EL element of the first organic EL panel than to the second organic EL element of the second organic EL panel.

* * * * *